(12) United States Patent
Shun et al.

(10) Patent No.: US 12,719,434 B2
(45) Date of Patent: Aug. 25, 2026

(54) ACOUSTIC WAVE DEVICE AND METHOD FOR PRODUCING SAME

(71) Applicant: Sanan Japan Technology Corporation, Tokyo (JP)

(72) Inventors: Subei Shun, Tokyo (JP); Shinichi Shioi, Tokyo (JP)

(73) Assignee: Sanan Japan Technology Corporation, Tokyo (JP)

( * ) Notice: Subject to any disclaimer, the term of this patent is extended or adjusted under 35 U.S.C. 154(b) by 124 days.

(21) Appl. No.: 18/424,288

(22) Filed: Jan. 26, 2024

(65) Prior Publication Data

US 2024/0258983 A1 Aug. 1, 2024

(30) Foreign Application Priority Data

Jan. 30, 2023 (JP) ................................ 2023-012377

(51) Int. Cl.

*H03H 3/08* (2006.01)
*H03H 9/02* (2006.01)
*H03H 9/64* (2006.01)

(52) U.S. Cl.

CPC .......... *H03H 3/08* (2013.01); *H03H 9/02543* (2013.01); *H03H 9/02834* (2013.01); *H03H 9/6483* (2013.01)

(58) Field of Classification Search

CPC .. H03H 3/08; H03H 9/02834; H03H 9/02574; H03H 9/02614; H03H 9/02732; H03H 9/058; H03H 9/1064; H03H 9/25

See application file for complete search history.

(56) References Cited

U.S. PATENT DOCUMENTS 3,290,595 A * 12/1966 Novotny ................ G01R 19/18 310/317
8,334,577 B2 * 12/2012 Kano ..................... B82Y 20/00 257/97
10,854,776 B1 * 12/2020 Raring ................. H10D 62/824
2006/0183625 A1 * 8/2006 Miyahara .............. C04B 35/565 501/153

(Continued)

FOREIGN PATENT DOCUMENTS

CA 2710282 A1 * 7/2009 ......... C23C 18/1216
CN 110504941 B * 9/2023 ......... B23K 26/0006

(Continued)

OTHER PUBLICATIONS

Translation of CN-110504941-B (Year: 2023).*

(Continued)

*Primary Examiner* — Jeffrey T Carley

(74) *Attorney, Agent, or Firm* — Dorsey & Whitney LLP

(57) ABSTRACT

A method for manufacturing an acoustic wave device includes polishing a sapphire substrate, placing a magnesium oxide substrate or magnesium oxide powder on a main surface of the sapphire substrate, forming a polycrystalline spinel layer by heat treatment, removing the magnesium oxide from spinel layer and polishing the polycrystalline spinel layer, and forming a piezoelectric substrate on the polycrystalline spinel layer. The heat treatment is performed at a temperature of from 1300° C. to 1600° C. for a duration of from 0.1 hours to 48 hours.

5 Claims, 5 Drawing Sheets

(56) References Cited

U.S. PATENT DOCUMENTS

| | | | | |
|---|---|---|---|---|
| 2009/0256444 | A1* | 10/2009 | Suzuki | H03H 9/02834 310/313 B |
| 2019/0379347 | A1* | 12/2019 | Goto | H03F 3/72 |
| 2021/0159881 | A1* | 5/2021 | Caron | H03H 9/6436 |
| 2022/0406953 | A1* | 12/2022 | Cardwell | H10F 77/12485 |
| 2023/0344408 | A1* | 10/2023 | Torazawa | H03H 9/14502 |

FOREIGN PATENT DOCUMENTS

| | | | | | |
|---|---|---|---|---|---|
| CN | 116961615 | A | * | 10/2023 | H03H 9/02574 |
| CN | 118413205 | A | * | 7/2024 | H03H 9/6489 |
| WO | WO-03048431 | A1 | * | 6/2003 | C30B 15/04 |
| WO | WO-2005071720 | A1 | * | 8/2005 | H10H 20/01335 |
| WO | WO-2008097385 | A1 | * | 8/2008 | H10N 10/855 |
| WO | WO-2011034136 | A1 | * | 3/2011 | H03H 9/02574 |
| WO | WO-2012033125 | A1 | * | 3/2012 | C04B 35/443 |
| WO | WO-2015186571 | A1 | * | 12/2015 | C04B 35/195 |
| WO | WO-2020044925 | A1 | * | 3/2020 | H01L 21/185 |

OTHER PUBLICATIONS

Translation of WO-2011034136-A1 (Year: 2011).*
Translation of WO-2012033125-A1 (Year: 2012).*
Translation of WO-2015186571-A1 (Year: 2015).*
Translation of WO-2020044925-A1 (Year: 2020).*
Translation of CN-116961615-A (Year: 2023).*
Translation of CN-118413205-A (Year: 2024).*

* cited by examiner

ACOUSTIC WAVE DEVICE AND METHOD FOR PRODUCING SAME

CROSS-REFERENCE TO RELATED APPLICATION(S)

This application claims priority to Japanese Application No. 2023-012377, filed Jan. 30, 2023, which are incorporated herein by reference, in their entirety, for any purpose.

BACKGROUND OF THE INVENTION

Field of the Invention

The present disclosure relates to an acoustic wave device and a method for producing the same. More specifically, the present disclosure relates to a surface acoustic wave device using SH wave, such as a filter, a duplexer, or a multiplexer.

Background Art

High-frequency communication system for mobile communication terminals typified by smartphones adopts a high-frequency filter or the like to remove undesired signals other than frequency bands used for communication.

The acoustic wave device having a surface acoustic wave (SAW: Surface Acoustic Wave) element is used as a high-frequency filter or the like. The SAW element is the element that includes IDT (Interdigital Transducer) having a pair of comb-shaped electrodes on a piezoelectric substrate.

Surface acoustic wave devices are produced as follows. A piezoelectric substrate propagating an acoustic wave and a multilayer film substrate bonding a support substrate having thermal expansion coefficient lower than that of the piezoelectric substrate are formed. Next, a plurality of IDT electrodes are formed on the multilayer film substrate using a photolithography technique, and then a surface acoustic wave device is cut into a predetermined size by dicing. The support substrate using the multilayer film substrate suppresses the change in the size of the piezoelectric substrate when the temperature changes, as a result, this producing method can stabilize frequency characteristic of the acoustic wave device.

According to Patent Document 1 (JP2009-278610) and the like, in order to improve the temperature characteristics of an acoustic wave device, it is known that a support substrate such as a sapphire substrate having a high Young's modulus and a low linear expansion coefficient is bonded to a piezoelectric substrate to suppress expansion and contraction due to temperature change.

As disclosed in Patent Document 1, in order to improve the temperature characteristics of an acoustic wave device, it is known that a support substrate such as a sapphire substrate having a high Young's modulus and a low linear expansion coefficient is bonded to a piezoelectric substrate to suppress expansion and contraction due to temperature change. However, spurious wave occurs particularly on the high-frequency side in such support substrate, and the filter characteristics are inferior.

In addition, it is known to use a polycrystalline substrate such as a spinel as a support substrate that does not have the effect of improving temperature characteristics like a sapphire substrate, but does not easily cause spurious wave. However, temperature characteristics such as a sapphire substrate cannot be realized.

SUMMARY OF THE INVENTION

Some examples described herein may address the above-described problems. Some examples described herein may has an object to provide an acoustic wave device having a higher temperature characteristic and a more suppressed spurious property, and a method for producing the same.

In some examples, an acoustic wave device includes a high acoustic velocity substrate, a medium acoustic velocity layer formed on a main surface of the high acoustic velocity substrate, a piezoelectric substrate formed directly or via another layer on the main surface of the medium acoustic velocity layer, wherein an acoustic velocity is slowed down gradually from the main surface of the high acoustic velocity substrate toward the main surface of the medium acoustic velocity layer between the high acoustic velocity substrate and the medium acoustic velocity layer. According to the present invention, it is possible to provide an acoustic wave device having a high-improved temperature characteristic and a more suppressed spurious property, and a method for producing the same.

DETAILED DESCRIPTION

Figure 1:
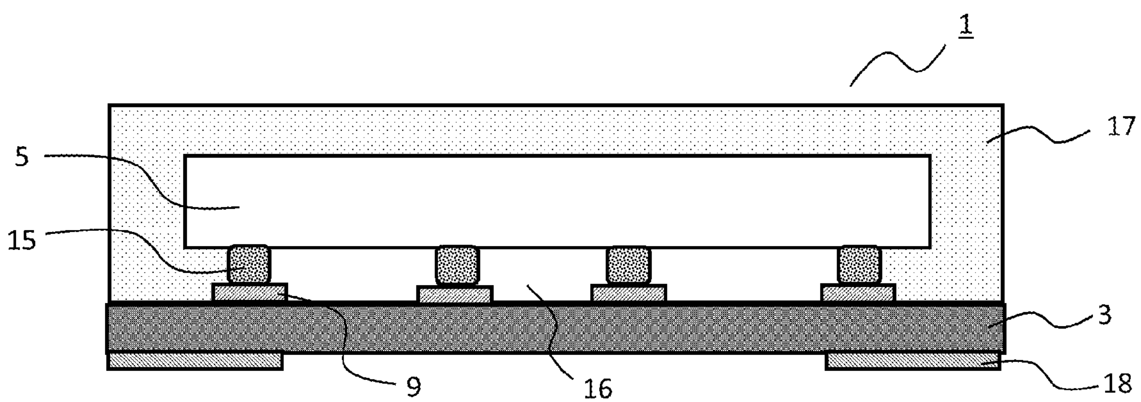
FIG. 1 is a cross-sectional view of an acoustic wave device 1 according to a first embodiment.

The embodiments will be described with reference to the accompanying drawings. In the drawings, the same or corresponding parts are denoted by the same reference numerals. Duplicate descriptions of such portions may be simplified or omitted.

First Embodiment

FIG. 1 is a cross-sectional view of an acoustic wave device 1 according to a first embodiment.

As shown in FIG. 1, the acoustic wave device 1 includes a wiring substrate 3, external connection terminals 18, a device chip 5, electrode pads 9, bumps 15, and a sealing portion 17.

The wiring substrate 3 is a multilayer substrate made of resin. For example, the wiring substrate 3 is a low-temperature co-fired ceramic (Low Temperature Co-Fired Ceramics: LTCC) multilayer substrate includes a plurality of dielectric layers.

The plurality of external connection terminals 18 are formed on the lower surface of the wiring substrate 3.

The plurality of electrode pads 9 are formed on the main surface of the wiring substrate 3. For example, the electrode pads 9 are formed of copper or an alloy containing copper. For example, the electrode pads 9 have the thickness of 10 μm to 20 μm.

The bumps 15 are formed on each upper surface of the electrode pads 9. The bumps 15 are gold bumps for example. The bump 15 has the height of 10 μm to 50 μm for example.

An air gap 16 is formed between the wiring substrate 3 and the device chip 5.

The device chip 5 is mounted on the wiring substrate 3 via the bumps 15 by flip-chip bonding. The device chip 5 is electrically connected to the plurality of electrode pads 9 via the plurality of bumps 15.

The device chip 5 is a substrate on which acoustic wave elements 50 are formed. For example, a transmitting filter and a reception filter including the plurality of acoustic wave elements 50 are formed on the main surface of the device chip 5.

The transmitting filter is formed so that an electrical signal of a desired frequency band can pass through. For example, the transmitting filter is a ladder filter including a plurality of series resonators and a plurality of parallel resonators.

The reception filter is formed so that an electrical signal of a desired frequency band can pass through. For example, the reception filter is a ladder filter.

The device chip 5 includes a piezoelectric substrate 11. The sealing portion 17 is formed so as to cover the device chip 5. The sealing portion 17 is formed of an insulator such as a synthetic resin. The sealing portion 17 is made of metal for example.

In case the sealing portion 17 is made of a synthetic resin, epoxy resin, polyimide, or the like can be used as the synthetic resin. Preferably, an epoxy resin is used to form the sealing portion 17 with a low temperature curing process.

Figure 2:
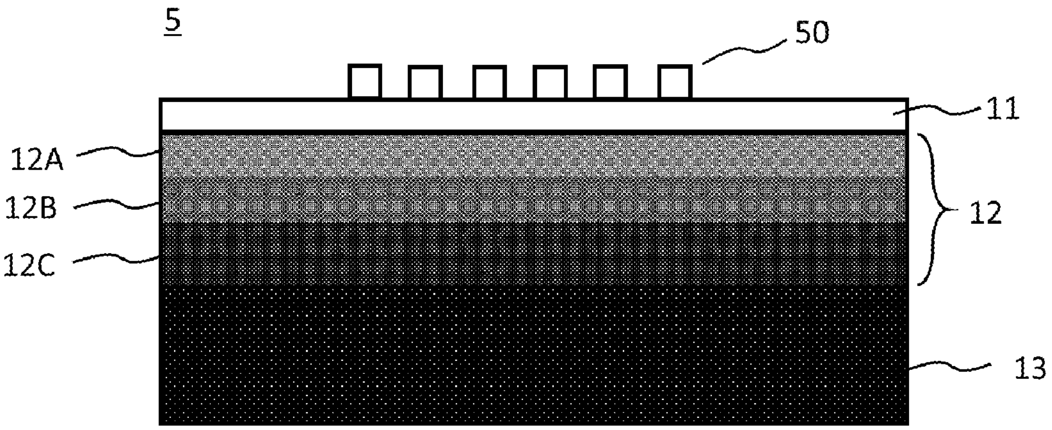
FIG. 2 is a cross-sectional showing a device chip 5 of the acoustic wave device 1 according to the first embodiment.

FIG. 2 is a cross-sectional showing the device chip 5 of the acoustic wave device 1 according to the first embodiment.

As shown in FIG. 2, the device chip 5 includes the piezoelectric substrate 11, a medium acoustic velocity layer 12, and a high acoustic velocity substrate 13. The acoustic wave elements 50 are formed on the piezoelectric substrate 11.

The piezoelectric substrate 11 is, for example, a substrate made of a piezoelectric single crystal such as lithium tantalate, lithium niobate, or quartz. In another example, the piezoelectric substrate 11 is a substrate made of piezoelectric ceramics.

The thickness of the piezoelectric substrate 11 may be 0.3 μm to 5 μm for example.

The medium acoustic velocity layer 12 can be appropriately formed of a material having a bulk wave acoustic velocity higher than that of the bulk wave propagating through the piezoelectric substrate 11, and lower than that of the bulk wave propagating through the high acoustic velocity substrate 13. The medium acoustic velocity layer 12 is spinel for example. The medium acoustic velocity layer 12 is configured so that the acoustic velocity is slowed down gradually from the main surface of the high acoustic velocity substrate 13 toward the main surface of the medium acoustic velocity layer 12 opposed to the piezoelectric substrate 11. A medium acoustic velocity layer 12A has a lower acoustic velocity than a medium acoustic layer 12B. The medium acoustic layer 12B has a lower acoustic velocity than a medium acoustic layer 12C.

The medium acoustic velocity layer 12A may be a spinel layer having a stoichiometric $MgAl_2O_4$ or a spinel layer nearly having stoichiometric spinel. The thickness of the medium acoustic velocity layer 12A may be 10 μm to 20 μm for example. The medium acoustic velocity layer 12A may be a single-crystal spinel or a polycrystalline spinel, but is preferably the polycrystalline spinel. This is because the polycrystalline spinel suppresses further spurious by scattering the reflection of the bulk wave propagating through the piezoelectric substrate 11.

The medium acoustic velocity layer 12B is non-stoichiometric spinel and including less magnesium (Mg) and more aluminum (Al) as compared with stoichiometric spinel. The thickness of the medium acoustic velocity layer 12B may be 10 μm to 20 μm for example.

The medium acoustic velocity layer 12C is non-stoichiometric spinel and including further less magnesium (Mg) and more aluminum (Al) as compared with the spinel of the medium acoustic velocity layer 12B. The thickness of the medium acoustic velocity layer 12C may be 10 μm to 20 μm for example.

The acoustic velocity is slowed down gradually from the main surface of the high acoustic velocity substrate 13 toward the main surface of the medium acoustic velocity layer 12, that is, from the medium acoustic velocity layer 12C toward 12A. In the present embodiment, an example in which the acoustic velocity is slowed down in three stages is described, but it may be configured so that the acoustic velocity is slowed down in more multiple stages. The same applies to the second and its subsequent embodiments described below.

The high acoustic velocity substrate 13 can be appropriately formed of a material having a bulk wave acoustic velocity higher than that of the bulk wave propagating through the piezoelectric substrate 11. Such a material may be made of, for example, sapphire, alumina, silicon nitride, aluminum nitride, aluminum oxide, silicon carbide, silicon oxynitride, diamond, or the like, in accordance with the material constituting the piezoelectric substrate 11.

The thickness of the high acoustic velocity substrate 13 may be 50 μm to 200 μm for example.

Figure 3:
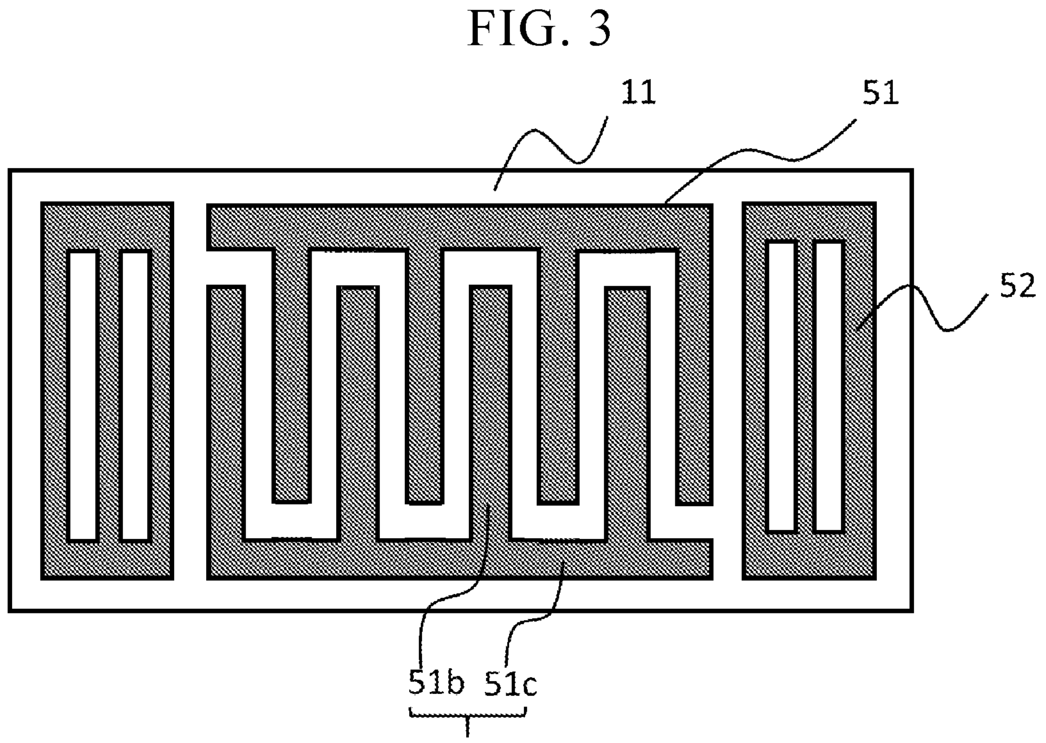
FIG. 3 is a diagram illustrating an example of acoustic wave elements of the acoustic wave device 1 according to the first embodiment.

Next, the example of acoustic wave elements formed on the piezoelectric substrate 11 is described with reference to FIG. 3. FIG. 3 is a diagram illustrating the example of acoustic wave elements of the acoustic wave device 1 according to the first embodiment.

As shown in FIG. 3, IDT (Interdigital Transducer) electrodes 51 and a pair of reflectors 52 are formed on the main surface of the piezoelectric substrate 11. The IDT electrodes 51 and the pair of reflectors 52 are provided so as to excite acoustic waves (mainly SH waves).

The IDT electrodes 51 and the pair of reflectors 52 are made of an alloy of aluminum and copper for example. The IDT electrodes 51 and the pair of reflectors 52 are made of a suitable metal such as aluminum, molybdenum, iridium, tungsten, cobalt, nickel, ruthenium, chromium, strontium, titanium, palladium, or silver, or an alloy thereof.

The IDT electrodes 51 and the pair of reflectors 52 are formed of a laminated metal film in which a plurality of metal layers are laminated. The thicknesses of the IDT electrodes 51 and the pair of reflectors 52 are 150 nm to 450 nm for example.

The IDT electrodes 51 include a pair of comb-shaped electrode 51*a*. The pair of comb-electrodes 51*a* are opposed to each other. The comb-shaped electrodes 51*a* include a plurality of electrode fingers 51*b* and a busbar 51*c*.

The plurality of finger 51*b* are longitudinally aligned. The busbar 51*c* connects the plurality of finger 51*b*.

One of the pair of reflectors 52 adjoins one of the IDT electrodes 51. The other of the pair of reflectors 52 adjoins the other side of IDT electrodes 51.

According to the first embodiment described above, it is possible to provide an acoustic wave device having higher temperature characteristics and more suppressing spurious.

Second Embodiment

Figure 4:
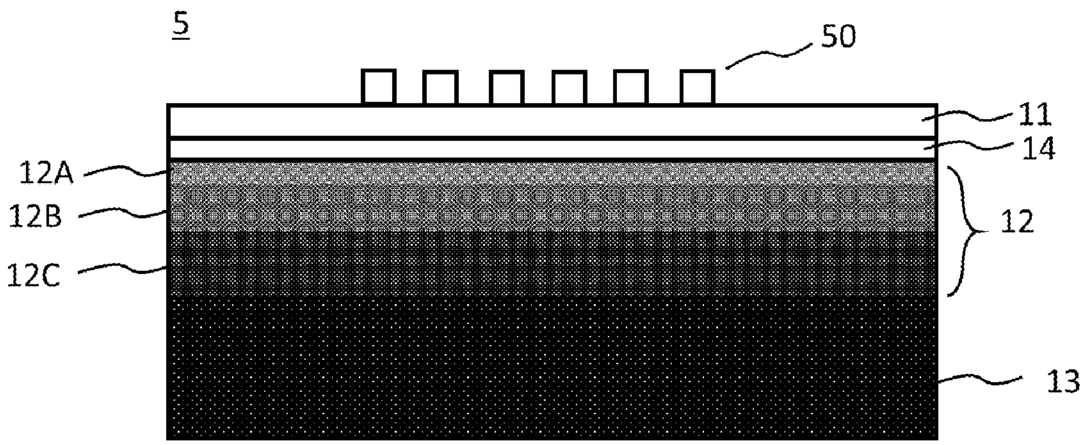
FIG. 4 is a cross-sectional view showing the device chip 5 of the acoustic wave device 1 according to a second embodiment.

FIG. 4 is a cross-sectional view showing the device chip 5 of the acoustic wave device 1 according to a second embodiment. As shown in FIG. 4, the device chip 5 according to the second embodiment includes a low acoustic velocity layer 14 disposed between the piezoelectric substrate 11 and the medium acoustic velocity layer 12.

The low acoustic velocity layer 14 can be appropriately formed of a material having a bulk wave acoustic velocity lower than that of the bulk wave propagating through the piezoelectric substrate 11. Such a material may be made of, for example, silicon oxide, glass, silicon oxynitride, tantalum oxide, or a compound obtained by adding fluorine, carbon, or boron to silicon oxide, or the like, in accordance with the material constituting the piezoelectric substrate 11.

The thickness of the low acoustic velocity layer 14 may be 0.5 μm to 5 μm for example. In order to confine the surface acoustic wave to the portion where the piezoelectric substrate 11 and the low acoustic velocity layer 14 are laminated, the thicker the medium acoustic velocity layer 12 and the high acoustic velocity substrate 13 are, the more preferable. The thickness of the medium acoustic velocity layer 12 and the high acoustic velocity substrate 13 is preferably 0.5 times or more, more preferably 1.5 times or more the wavelength λ of the surface acoustic wave. Quality factor value can be improved by confining the energy of SH wave.

Since the other configuration is the same as that of the first embodiment, the description thereof is omitted.

According to the second embodiment described above, it is possible to provide an acoustic wave device having high-improved temperature characteristics, suppressing spurious, and improved quality factor value.

Figure 5:
FIG. 5 is a diagram for explaining a method for producing the acoustic wave device 1.
Figure 5:
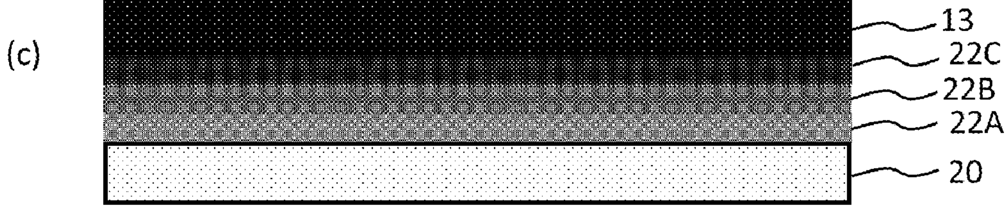

Next, a method for producing the acoustic wave device 1 will be described. FIG. 5 is a diagram for explaining the method for producing the acoustic wave device 1.

As shown in FIG. 5 part (a), the high acoustic velocity substrate 13 and a magnesium oxide substrate 20 are prepared. The high acoustic velocity substrate 13 is a sapphire substrate that is a single crystal. The crystalline surface of the surface of the sapphire substrate is a C plane, and mirror polishing the both surfaces of the substrate is preferable. For example, alumina that is polycrystalline can also be used in addition to sapphire that is a single crystal. In the magnesium oxide substrate 20, it is desirable to preliminary calcine the highest-purity basic magnesium carbonate at 1300° C. It is desirable to form a sintered compact having a porosity of 12% or less by forming under the pressure of 3 ton/cm$^2$ and calcining at 1700° C. for 2 hours. The magnesium oxide is obtained by mirror polishing this. In addition, the magnesium oxide substrate 20 may be formed of a single crystal having a smooth cleavage surface along the crystallographic planes (100) of a crystal lump of fused magnesium oxide.

As shown in FIG. 5 part (b), the sapphire substrate and the mirror-polished surface of the magnesium oxide substrate 20 are bonded to each other. A diffusion annealing heat treatment is performed at this process. According to an example of a prototype conducted by the inventors, when heated at about 1600° C. for 24 hours, a spinel layer was formed to about 400 μm. In the diffusion annealing heat treatment, it is possible to adjust appropriately the temperature and the heating time in accordance with the desired thickness of the sapphire substrate and the thickness of the spinel layer as the support substrate. The diffusion annealing heat treatment is performed, for example, at 1500° C. to 1800° C. for 0.5 hours to 100 hours. It is desirable that the diffusion annealing heat treatment is performed at, for example, 1500° C. to 1600° C. for 0.1 hour to 10 hours. This sufficiently secures the thickness of the sapphire substrate for ensuring the temperature characteristics while forming the polycrystalline spinel layer having a sufficient thickness to scatter unnecessary waves.

As shown in FIG. 5 part (c), a spinel layer is formed between the sapphire substrate and the magnesium oxide substrate 20 after the diffusion annealing heat treatment. According to the prototype conducted by the inventors, a spinel layer 22A in the region closest to the magnesium oxide substrate 20 was measured to be 18.7830 percent by weight of magnesium, 48.6800 percent by weight of aluminum, and 32.5330 percent by weight of oxygen atoms, which was approximately equivalent to the stoichiometric spinel. The atomic weight of magnesium is 24.3050, the atomic weight of aluminum is 26.9810, the atomic weight of oxygen is 15.9990, and the stoichiometric spinel ($MgAl_2O_4$)1 mol is 142. 2630.

A spinel layer 22B in the region second closest to the magnesium oxide substrate 20 was measured to be 1.4730 percent by weight of magnesium, 77.7570 percent by weight of aluminum, and 20.7700 percent by weight of oxygen atoms. The spinel layer 22B is the non-stoichiometric spinel including less magnesium than stoichiometric spinel, the acoustical properties that are closer to sapphire than the stoichiometric spinel, and the acoustic velocity that is faster than the spinel layer 22A.

A spinel layer 22C in the region furthest from the magnesium oxide substrate 20 was measured to be 0.2710 percent by weight of magnesium, 64.6190 percent by weight of aluminum, and 35.1100 percent by weight of oxygen atoms. The spinel layer 22C is the non-stoichiometric spinel including further less magnesium than the spinel layer, the acoustical properties that are closer to sapphire than the spinel layer 22B, and the acoustic velocity that is faster than the spinel layer 22B.

After the diffusion annealing heat treatment, the interface between the spinel layer 22A and the magnesium oxide substrate 20 could be easily peeled off by interface fracture. The surface of the spinel layer 22A was polished and bonded to the piezoelectric substrate 11 after peeling. The acoustic wave elements 50 were constructed to obtain desired device characteristics, then the acoustic wave device 1 was obtained after a packaging process.

Figure 6:
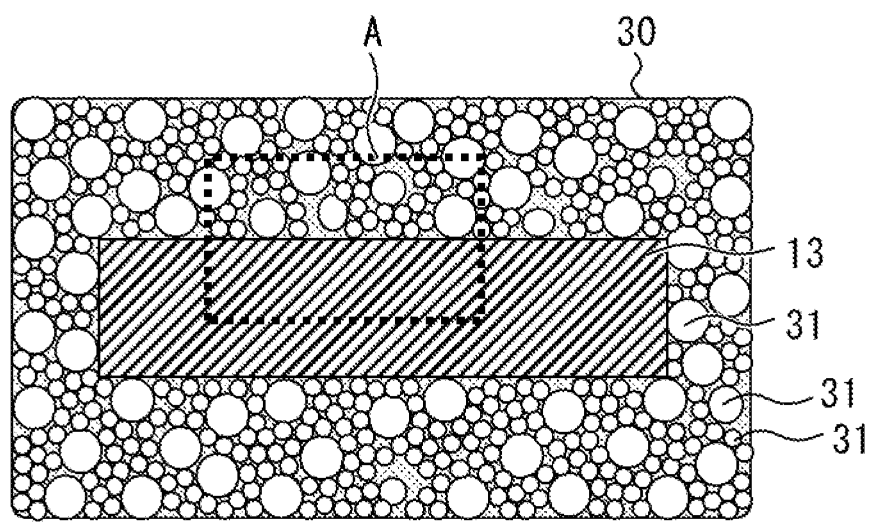
FIG. 6 is a diagram for explaining a second method for producing the acoustic wave device 1.

Next, a second method for producing the acoustic wave device 1 will be described. FIG. 6 is a diagram for explaining the second method for producing the acoustic wave device 1.

As shown in FIG. 6, the high acoustic velocity substrate 13 and a powdery magnesium oxide 31 are prepared. The high acoustic velocity substrate 13 and the powdery magnesium oxide 31 are disposed in a heating furnace 30 capable of heat treatment. The high acoustic velocity substrate 13 is a sapphire substrate which is a single crystal. The crystalline surface of the surface of the sapphire substrate is the C plane, and both surfaces of the substrate are mirror-polished. For example, alumina that is polycrystalline can also be used in addition to sapphire that is a single crystal. The powdery magnesium oxide 31 may have an average particle size of, for example, 1 μm to 25 μm. The sapphire substrate is embedded in the powdery magnesium oxide 31, and a diffusion annealing heat treatment is performed. According to an example of a prototype conducted by the inventors, the spinel layer was formed to about 75 μm as a result of heat treatment at about 1450° ° C. for 24 hours. In the diffusion annealing heat treatment, it is possible to adjust appropriately the temperature and the heating time in accordance with the desired thickness of the sapphire substrate and the thickness of the spinel layer as the support substrate. The diffusion annealing heat treatment is performed, for example, at 1300° ° C. to 1600° ° C. for 10 hours to 48 hours. It is desirable that the diffusion annealing heat treatment is performed at, for example, 1400° ° C. to 1500° C. for 20 hours to 28 hours. This sufficiently secures the thickness of the sapphire substrate for ensuring the temperature characteristics while forming the polycrystalline spinel layer having a sufficient thickness to scatter unnecessary waves.

Figure 7:
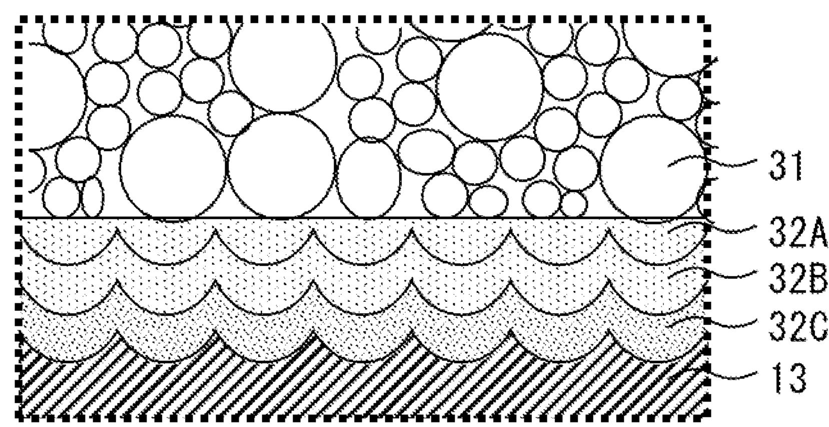
FIG. 7 is a diagram illustrating a region A surrounded by a dotted line in FIG. 6.

FIG. 7 is a diagram illustrating a region A surrounded by a dotted line in FIG. 6. As shown in FIG. 7, spinel layers 32A to 32C formed in the surface of the sapphire substrate (high acoustic velocity substrate 13) form uneven structure. Since the powdery magnesium oxide 31 has a variation in particle size, a portion where the powdery magnesium oxide 31 presents densely on the surface of the sapphire substrate (high acoustic velocity substrate 13) and a portion where it does not present densely are formed. In the portion where the powdery magnesium oxide 31 presents densely present spinalization proceeds rapidly. In the portion where the powdery magnesium oxide 31 does not present densely, spinalization proceeds slowly. This makes the spinel layers 32A to 32C uneven structure. As a result, the bulk waves of the acoustic wave device 1 are more scattered, and can suppress spurious further.

According to the second manufacturing process of the acoustic wave device 1, the spinel layers 32A to 32C are formed on both surfaces of the sapphire substrate (the high acoustic velocity substrate 13). That is, the spinel layers 32A to 32C, which are the medium acoustic velocity layer 12, is formed on both surfaces of the high acoustic velocity substrate 13. This make it possible to avoid the substrate from being warped due to a difference in thermal expansion coefficient between the sapphire substrate and the spinel layer in the step of returning from a high temperature of, for example, 1450° C. to a normal temperature. This can provide the acoustic wave device including a device chip with improved planarity.

Since the subsequent steps are the same to the method for producing the acoustic wave device 1 described above, a description thereof is omitted.

Third Embodiment

Figure 8:
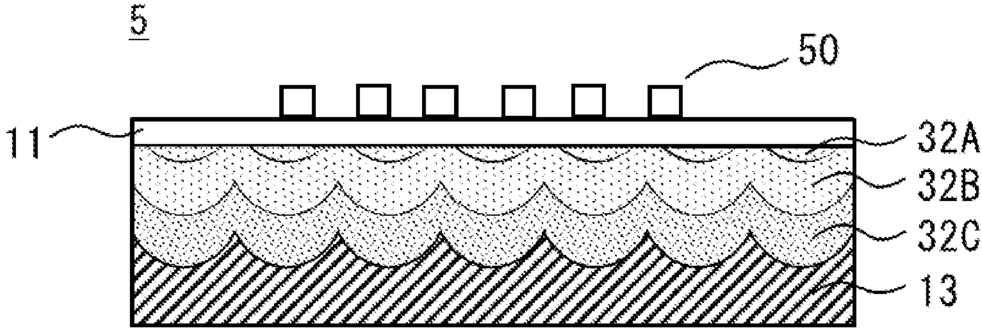
FIG. 8 is a cross-sectional view showing the device chip 5 of the acoustic wave device 1 according to a third embodiment.

FIG. 8 is a cross-sectional view showing the device chip 5 of the acoustic wave device 1 according to a third embodiment. There are a region where the piezoelectric substrate 11 is in contact with the spinel layer 32A and a region where the piezoelectric substrate 11 is in contact with the spinel layer 32B in the device chip 5 of the acoustic wave device 1 according to the third embodiment. The spinel layer 32A may be, for example, a layer substantially equivalent to the stoichiometric spinel. The spinel layer 32B is the non-stoichiometric spinel layer including less magnesium than the spinel layer 32A, the acoustical properties that are closer to sapphire than the spinel layer 32A, and the acoustic velocity that is faster than the spinel layer 32A. The spinel layer 32C is the non-stoichiometric spinel layer including further less magnesium than the spinel layer 32B, the acoustical properties that are closer to sapphire than the spinel layer 32B, and the acoustic velocity that is faster than the spinel layer 32B.

The acoustic wave device 1 according to the third embodiment can be produced, for example, by the second method for producing the acoustic wave device 1 described above. Since the spinel layers 32A to 32C forms an uneven structure on the sapphire substrate (high acoustic velocity substrate 13), polishing is performed on the spinel layer 32A so that the spinel layer 32B is exposed and the spinel layer 32A remains. Next, the piezoelectric substrate 11 may be bonded. The acoustic wave device 1 according to the third embodiment, can suppress spurious further by scattering the bulk wave of the acoustic wave device 1.

Forth Embodiment

Figure 9:
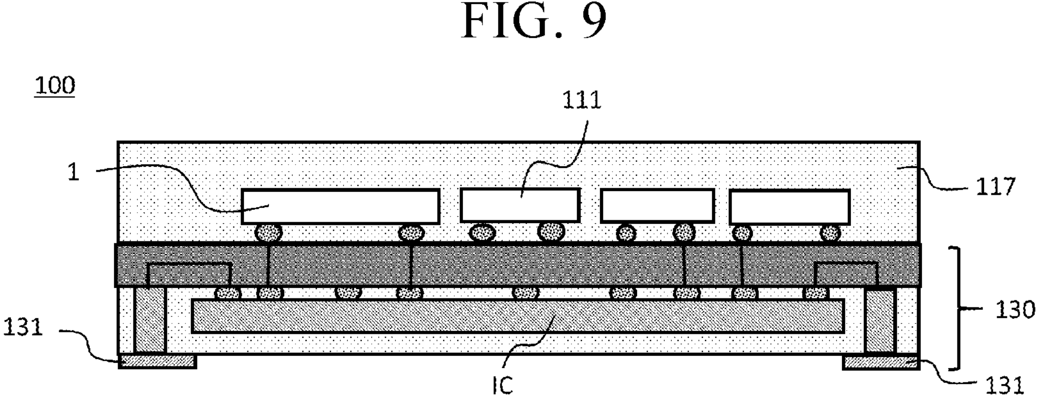
FIG. 9 is a cross-sectional view of a module to which the acoustic wave device 1 is applied.

FIG. 9 is a cross-sectional view of a module to which the acoustic wave device 1 is applied according to the first embodiment to the third embodiment. The same or corresponding parts with the first embodiment are denoted by the same reference numerals. Duplicate descriptions of such portions may be simplified or omitted.

In FIG. 9, a module 100 includes a wiring substrate 130, a plurality of external connection terminals 131, an integrated circuit component IC, the acoustic wave device 1, an inductor 111, and a sealing portion 117.

The plurality of external connection terminals 18 are formed on the lower surface of the wiring substrate 130. The plurality of external connection terminals 131 are mounted on the motherboard of the mobile communication terminal which is set in advance.

For example, the integrated circuit component IC is mounted inside the wiring substrate 130. The integrated circuit component IC includes a switching circuit and a low noise amplifier.

The acoustic wave device 1 is mounted on the main surface of the wiring substrate 130.

The inductor 111 is mounted on the main surface of the wiring substrate 130. The inductor 111 is mounted for impedance matching. For example, the inductor 111 is Integrated Passive Device (IPD).

The sealing portion 117 seals a plurality of electronic components including the acoustic wave device 1.

According to the fourth embodiment described above, the module 100 includes the acoustic wave device 1. This makes it possible to provide a module including an acoustic wave device having high-improved temperature characteristics and more suppressing spurious.

While several aspects of at least one embodiment have been described, it is to be understood that various modifications and improvements will readily occur to those skilled in the art. Such modifications and improvements are intended to be part of the present disclosure and are intended to be within the scope of the present disclosure.

It is to be understood that the embodiments of the methods and apparatus described herein are not limited in application to the structural and ordering details of the components set forth in the foregoing description or illustrated in the accompanying drawings. Methods and apparatus may be implemented in other embodiments or implemented in various manners.

Specific implementations are given here for illustrative purposes only and are not intended to be limiting.

The phraseology and terminology used in the present disclosure are for the purpose of description and should not be regarded as limiting. The use of "including," "comprising," "having," and variations thereof herein means the inclusion of the items listed hereinafter and equivalents thereof, as well as additional items.

The reference to "or" may be construed so that any term described using "or" may be indicative of one, more than one, and all of the terms of that description.

References to front, back, left, right, top, bottom, and side are intended for convenience of description. Such references are not intended to limit the components of the present disclosure to any one positional or spatial orientation. Accordingly, the foregoing description and drawings are by way of example only.

What is claimed is:

1. A method for producing an acoustic wave device, the method comprising:

a step of polishing a sapphire substrate;

a step of disposing magnesium oxide on a main surface of the sapphire substrate;

a step of forming a polycrystalline spinel layer by heat treatment;

a step of removing the magnesium oxide from the polycrystalline spinel layer and polishing the polycrystalline spinel layer; and a step of forming a piezoelectric substrate on the polycrystalline spinel layer.

2. The method according to claim 1, wherein the magnesium oxide is powdery and has an average particle size of 1 μm to 25 μm.

3. The method according to claim 1, wherein additional magnesium oxide is also disposed on another main surface of the sapphire substrate, and another polycrystalline spinel layer is also formed on the other main surface of the sapphire substrate.

4. The method according to claim 1, wherein the step of forming the polycrystalline spinel layer is performed at a temperature of 1500° C. to 1600° C. for 0.1 hours to 10 hours.

5. The method according to claim 1, wherein the magnesium oxide is powdery and has an average particle size of 1 μm to 25 μm, the heat treatment is performed at a temperature of 1300° C. to 1600° C. for 10 hours to 48 hours.

* * * * *